United States Patent
Liao et al.

(10) Patent No.: US 6,413,817 B1
(45) Date of Patent: Jul. 2, 2002

(54) METHOD OF FORMING SELF-ALIGNED STACKED CAPACITOR

(75) Inventors: Wunn-Shien Liao; Ching-Ming Lee; Ky Yang, all of Hsinchu (TW)

(73) Assignee: United Microelectronic Corp., Hsinchu (TW)

( * ) Notice: Subject to any disclaimer, the term of this patent is extended or adjusted under 35 U.S.C. 154(b) by 0 days.

(21) Appl. No.: 09/971,542

(22) Filed: Oct. 5, 2001

Related U.S. Application Data

(62) Division of application No. 09/621,923, filed on Jul. 24, 2000.

(51) Int. Cl.$^7$ .......................................... H01L 21/8242
(52) U.S. Cl. ..................... 438/255; 438/398; 438/964; 438/396; 438/253
(58) Field of Search ................... 438/964, 239–242, 438/250–256, 393–399

(56) References Cited

U.S. PATENT DOCUMENTS

| | | | | |
|---|---|---|---|---|
| 5,851,876 A | * | 12/1998 | Jenq | 438/253 |
| 5,874,335 A | * | 2/1999 | Jenq et al. | 438/253 |
| 5,895,239 A | * | 4/1999 | Jeng et al. | 438/239 |
| 6,054,394 A | * | 4/2000 | Wang | 438/738 |
| 6,080,620 A | * | 6/2000 | Jeng | 438/239 |
| 6,136,716 A | * | 10/2000 | Tu | 438/694 |
| 6,168,987 B1 | * | 1/2001 | Jeng et al. | 438/253 |
| 6,184,082 B1 | * | 2/2001 | Hsieh | 438/253 |
| 6,255,160 B1 | * | 7/2001 | Huang | 438/238 |
| 6,294,426 B1 | * | 9/2001 | Tu et al. | 438/241 |
| 6,309,941 B1 | * | 10/2001 | Parekh et al. | 438/255 |

FOREIGN PATENT DOCUMENTS

JP    2000164825 A  *  6/2000

* cited by examiner

*Primary Examiner*—John F. Niebling
*Assistant Examiner*—Jennifer M. Kennedy
(74) *Attorney, Agent, or Firm*—Charles C. H. Wu; Wu & Cheung, LLP

(57) ABSTRACT

A method of forming a self-aligned stacked capacitor on a substrate having a first insulation layer thereon. A bit line contact and a first section node contact are formed in the first insulation layer, and then a bit line structure is formed over the first insulation layer. The bit line structure includes a bit line, a cap layer and spacers. The bit line and the bit line contact are electrically connected. The cap layer is formed above the bit line while the spacers are formed on the sidewalls of the bit line and the cap layer. A second insulation layer, an etching stop layer and a third insulation layer are sequentially formed over the substrate. An opening is formed in the third insulation layer, the etching stop layer and the second insulation layer to expose a portion of the bit line structure and the first section node contact. A conformal first conductive layer is formed over the interior surface of the opening. The first conductive layer forms a second section node contact as well as a crown-shaped lower electrode. Finally, a conformal dielectric layer and a second conductive layer are sequentially formed over the substrate. The second conductive layer forms the upper electrode of the crown-shaped capacitor.

15 Claims, 5 Drawing Sheets

US 6,413,817 B1

METHOD OF FORMING SELF-ALIGNED STACKED CAPACITOR

The divisional of copending application Ser. No. 09/621,923 filed Jul. 24, 2000.

BACKGROUND OF THE INVENTION

1. Field of Invention

The present invention relates to a method of manufacturing a semiconductor device. More particularly, the present invention relates to a method of forming a self-aligned stacked capacitor.

2. Description of Related Art

Capacitor is one of the principle components in dynamic random access memory (DRAM). To prevent the storage of erroneous data in a DRAM unit and increase operating efficiency, a large area capacitor such as a crown capacitor is generally used in each DRAM cell. As the level of integration in DRAM increases, the need for larger surface area in each capacitor is urgent. One common method of increasing surface area of a capacitor is to place the capacitor and bit line on separate layers within a wafer resulting in a stacked type capacitor structure. In general, according to the position of the capacitor and the bit line, DRAM capacitors can be divided into a 'bit line on capacitor' (BOC) and a 'capacitor on bit line' (COB) type. However, the COB type is the more common DRAM capacitor type of the two.

FIGS. 1A, 1C, 2, 3 and 4 are schematic cross-sectional views showing the steps for forming a convention COB type of DRAM stacked capacitor. As shown in FIG. 1A, a substrate 100 is provided. The substrate 100 has isolation layers 110, gate oxide layers 120, word lines 130, a common source region 140 and a drain regions already formed thereon. The common source region 140 is formed between two word lines 130, the drain regions 150 are formed on one side of the word lines 130 and the isolation layers 110 are formed just outside the drain regions 150. A silicon oxide layer 155 is formed over the substrate 100, and then bit line contacts 160 and node contacts 170 are formed in the silicon oxide layer 155. A bit line 180 is formed over the silicon oxide layer 155. The bit line 180 is electrically connected with a bit line contact 160.

FIG. 1B is a top view of the structure shown in FIG. 1A. In fact, FIG. 1A is a cross-sectional view along line I—I of FIG. 1B. As shown in FIG. 1B, the node contacts 170 are formed between two bit lines 180.

FIG. 1C is a cross-sectional view along line II—II of FIG. 1B. As shown in FIG. 1C, another portion of the isolation layers 110 is formed on each side of the drain regions 150.

As shown in FIG. 2, a silicon oxide layer 190 is deposited over the substrate 100. Photolithographic and etching processes are next carried out to form a node contact opening 192 in the silicon oxide layer 190. A silicon nitride (SiN) liner layer 194 is formed on the sidewalls of the node contact opening 192. The liner layer 194 prevents short-circuiting between the subsequently formed second-stage node contact and the bit line 180.

As shown in FIG. 3, a polysilicon layer 210 is formed over the substrate 100. The polysilicon layer 210 completely fills the node contact opening 192 to form a node contact 200. The polysilicon layer 210 is patterned by photolithographic and etching processes.

As shown in FIG. 4, photolithographic and etching processes are carried out to pattern the polysilicon layer 210 to form the lower electrode 210a of a crown capacitor. Hemispherical silicon grains 220 are grown over the exposed surface of the crown-shaped lower electrode 210a so that surface area is increased. Finally, a conformal oxide/nitride/oxide composite layer 230 and a polysilicon layer 240 are sequentially formed over the lower electrode 210a to form a complete crown-shaped capacitor. The polysilicon layer 240 functions as the upper electrode of the crown-shaped capacitor.

However, the aforementioned method of forming a stacked capacitor has several drawbacks. Photolithographic and etching operations are required to pattern out both the lower electrode (patterning the polysilicon layer 210 in FIG. 3) as well as the outline of the crown-shaped lower electrode 210a (shown in FIG. 4). Hence, processing complexity is increased. In addition, if the alignment error of the lower electrode is large so that contact area between the polysilicon layer 210 and the node contact 200 is too small, a portion of the polysilicon layer 210 may shed. The shed polysilicon micro-particles can become a source of pollutants.

In the manufacturing of a conventional stacked capacitor as shown in FIG. 4, the lower electrode 210a of a crown-shaped capacitor has a height of about 8.5 KÅ. Thus, in any subsequent etching step for forming a contact opening, the process must face a large aspect ratio that may lead to etching stop.

Another drawback is the need to form a silicon nitride liner 194 as shown in FIGS. 2 and 3. Due to the relative closeness between the node contact 200 and the bit line 180, short-circuiting between the node contact 200 and bit line 180 can be common if there is any alignment error. Therefore, the formation of an insulating liner layer 194 between the node contact 200 and the bit line 180 is essential.

SUMMARY OF THE INVENTION

Accordingly, one object of the present invention is to provide a method of forming a self-aligned stacked capacitor capable of reducing processing complexity, pollution due to micro-particles and a high aspect ratio.

To achieve these and other advantages and in accordance with the purpose of the invention, as embodied and broadly described herein, the invention provides a method of forming a self-aligned stacked capacitor on a substrate having a first insulation layer thereon. A bit line contact and a first section node contact are formed in the first insulation layer, and then a bit line structure is formed over the first insulation layer. The bit line structure includes a bit line, a cap layer and spacers. The bit line and the bit line contact are electrically connected. The cap layer is formed above the bit line while the spacers are formed on the sidewalls of the bit line and the cap layer.

A second insulation layer, an etching stop layer and a third insulation layer are sequentially formed over the substrate. An opening is formed in the third insulation layer, the etching stop layer and the second insulation layer. The opening exposes a portion of the bit line structure and the first section node contact. A conformal first conductive layer is formed over the interior surface of the opening. The lower section of the first conductive layer forms a second section node contact as well as the lower portion of the crown-shaped lower electrode. The upper section of the first conductive layer is the crown portion of the lower electrode. The first conductive layer is formed by depositing conductive material over the substrate to form a conformal conductive layer, and then removing the conductive material outside the opening by chemical-mechanical polishing. Finally, a conformal dielectric layer and a second conductive layer are sequentially formed over the substrate. The second conductive layer forms the upper electrode of the crown-shaped capacitor.

An additional step of growing hemispherical silicon grains over the surface of the crown-shaped lower electrode can be conducted after forming the crown-shaped lower electrode but before forming the dielectric layer and the second conductive layer.

Furthermore, after the formation of the crown-shaped lower electrode, an additional step of removing the third insulation layer can be performed. The third insulation layer can be removed by wet etching, for example. Moreover, after the removal of the third insulation layer, a step for forming hemispherical silicon grains over the exposed surface of the crown-shaped lower electrode can be inserted.

This invention also provides a stacked capacitor structure formed by the aforementioned self-aligned method. The structure is formed above a substrate having a first insulation layer thereon. The structure includes a bit line contact, a first section node contact, a bit line structure, a second insulation layer, an etching stop layer, a second section node contact, a crown-shaped lower electrode, a dielectric layer and a crown-shaped upper electrode. The bit line contact and the first section node contact pierce through the first insulation layer and form an electrical contact with the substrate. The bit line structure includes a bit line, a cap layer and spacers. The bit line is formed over the first insulation layer and is electrically connected with the bit line. The cap layer is formed above the bit line while the spacers are formed on the sidewalls of the bit line and the cap layer.

The second insulation layer is formed above the first insulation layer. The second insulation layer has an opening so that the first section node contact and a portion of the bit line structure are not covered. The etching stop layer is formed above the second insulation layer. The second section node contact is formed within the opening and is electrically connected with the first section node contact. The lower portion of the crown-shaped lower electrode is formed inside the opening. Moreover, the lower portion of the crown-shaped lower electrode is integrated with the second section node contact. The lower portion of the crown-shaped lower electrode is conformal to the opening while the upper crown portion of the lower electrode protrudes above the opening. The dielectric layer is formed above the crown-shaped lower electrode and the etching stop layer. The crown-shaped upper electrode is formed above the dielectric layer.

In considering the aforementioned method of forming the stacked capacitor, a third insulation layer may form. Thus, the stack capacitor structure can further includes a third insulation layer above the etching stop layer. The third insulation layer encloses the upper portion of the crown-shaped lower electrode. The upper surface of the third insulation layer is at the same level as the upper surface of the crown-shaped lower electrode. Furthermore, the surface of the crown-shaped lower electrode may contain a layer of hemispherical silicon grains for increasing surface area of the ultimate crown-shaped capacitor.

In brief, the advantages of using the method of this invention to form a stacked capacitor include:

1. A self-aligned method is used in this invention to form a wide opening that pierces through the second insulation layer, the third insulation layer and the etching stop layer. This opening is then used as a mold for forming the second section node contact and the crown-shaped lower electrode. Hence, unlike a conventional method that uses photolithographic and etching repeatedly to define the position of the crown-shaped lower electrode and pattern out the shape of the crown-shaped lower electrode, the invention saves a lot of processing steps. In addition, the crown-shaped lower electrode is embedded within the opening in the third insulation layer, the etching stop layer and the second insulation layer. Hence, this invention is free from micro-particle pollution problems resulting from the conventional method where alignment errors in positioning the lower electrode can lead to the shedding of conductive material and the production of micro-particle pollutants.

2. The crown-shaped lower electrode is embedded within the opening in the third insulation layer, the etching stop layer and the second insulation layer so that the bottom portion of the crown-shaped lower electrode is at the same level as the bit line. Hence, overall processing height level is lowered. In other words, the aspect ratio in subsequent contact opening etching process is decreased and a higher tolerance for the contact opening is obtained.

3. The second section node contact is formed after a cap layer is formed over the bit line and spacers are formed on the sidewalls of the bit line respectively. Hence, short-circuiting between the node contact and the bit line due to alignment errors of the second section node contact is prevented. In other words, tolerance of photolithographic and etching processes for forming the node contact opening is increased. Furthermore, unlike the conventional method, this invention does not require the formation of a silicon nitride liner layer on the sidewalls of the second section node contact opening to prevent short-circuiting between the bit line and the second section node contact. Hence, this invention requires fewer processing steps.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
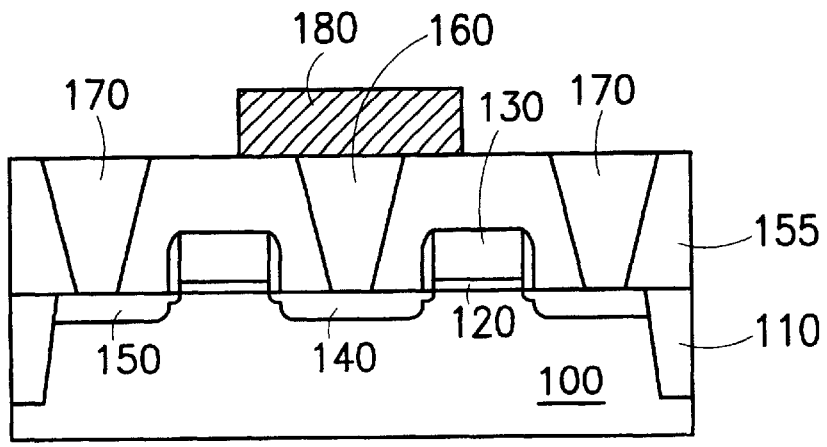
FIGS. 1A, 1C, 2, 3 and 4 are schematic cross-sectional views showing the steps for forming a conventional crown-shaped capacitor.
Figure 1B:
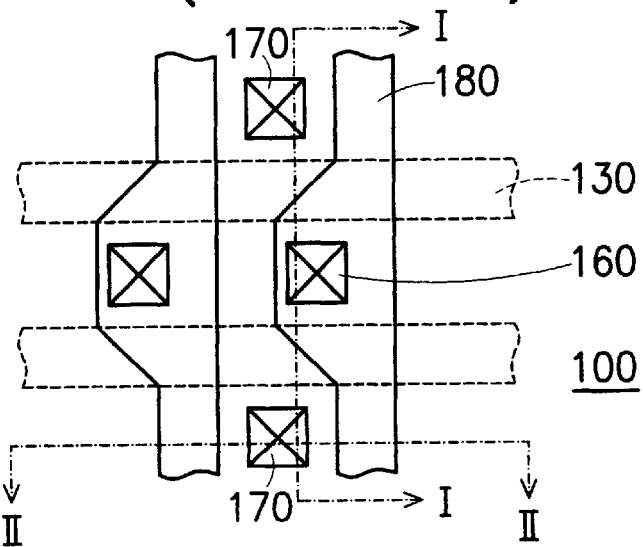
FIG. 1B is a top view of the structure shown in FIGS. 1A and 1C.
Figure 1C:
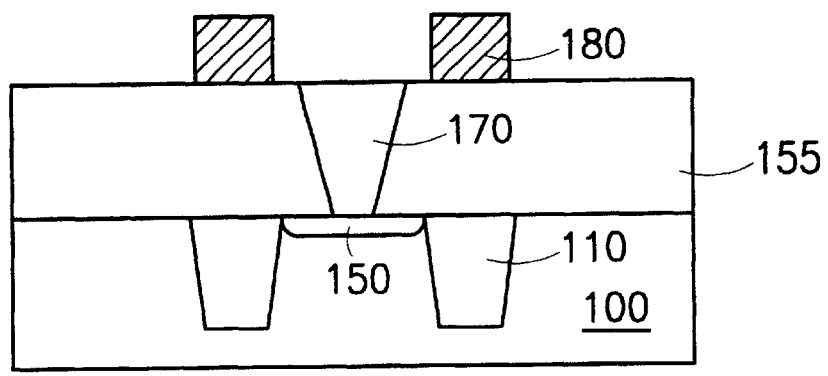
Figure 2:
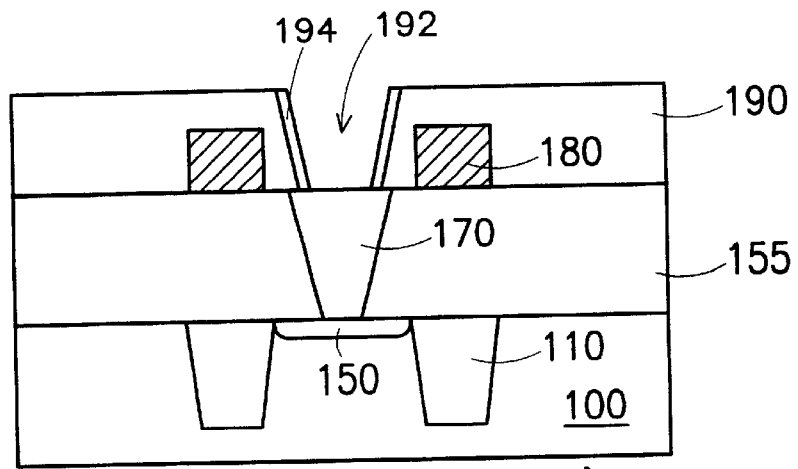
Figure 3:
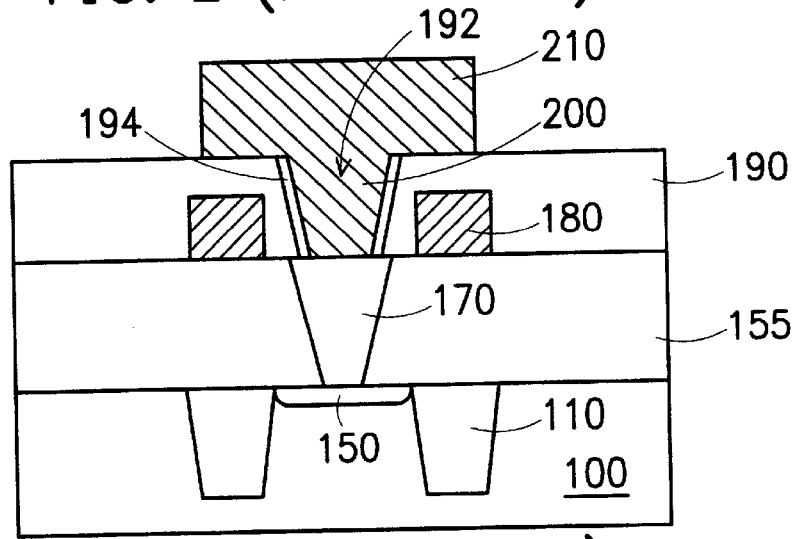
Figure 4:
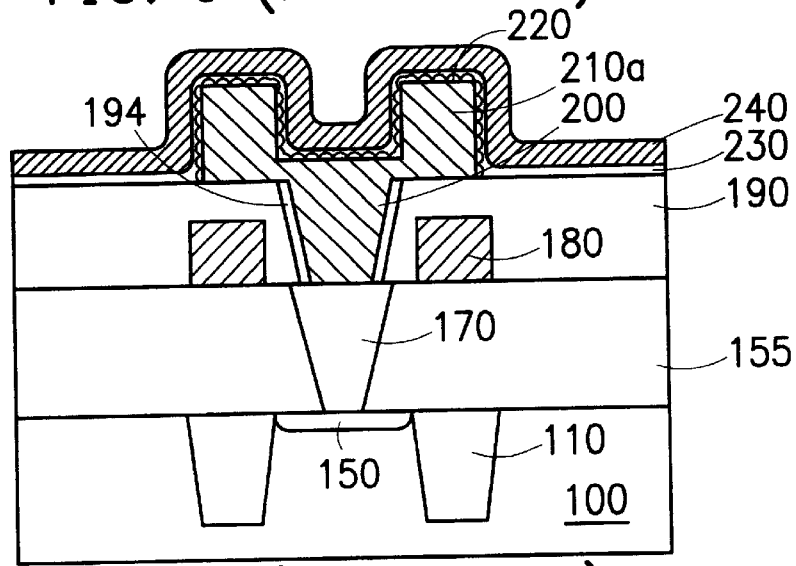

Reference will now be made in detail to the present preferred embodiments of the invention, examples of which are illustrated in the accompanying drawings. Wherever possible, the same reference numbers are used in the drawings and the description to refer to the same or like parts.

FIGS. 5A, 5C, 6, 7, 8, 9 and 10 are schematic cross-sectional views showing the steps for forming a crown-shaped capacitor according to one preferred embodiment of this invention.

Figure 5A:
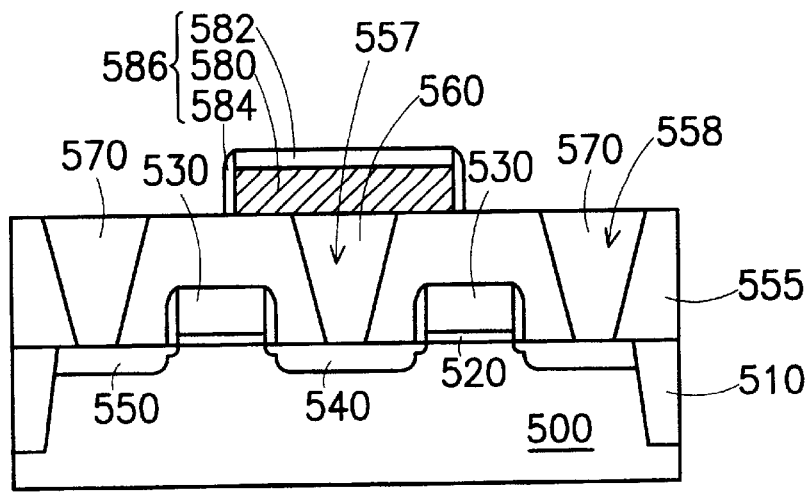
FIGS. 5A, 5C, 6, 7, 8, 9 and 10 are schematic cross-sectional views showing the steps for forming a crown-shaped capacitor according to one preferred embodiment of this invention.

As shown in FIG. 5A, a substrate 500 is provided. The substrate 500 has isolation layers 510, gate oxide layers 520, word lines 530, common source regions 540 and drain regions 550 already formed thereon. The common source region 540 is formed between the two word lines 530, the drain region is formed on one side of the word line 530, and the isolation layer 510 is formed just outside the drain region 550. An insulation layer 555 is formed over the substrate 500, and then a bit line contact opening 557 is formed in the insulation layer 555. The bit line contact opening 557 is formed above the common source region 540. Meanwhile, a node contact opening 558 is formed in the insulation layer 555 above the drain region 550.

In the subsequent step, a conductive layer (not shown) is formed over the substrate 500. The conductive layer is sufficiently thick to fill the bit line contact opening 557 and the node contact opening 558. Ultimately, a bit line contact 560 that connects electrically with the common source region 540 and a node contact 570 that connects electrically with the drain region 550 are formed. An insulation layer (not shown) is next formed over the conductive layer. Photolithographic and etching operations are sequentially carried out to pattern the insulation layer and the conductive layer. The retained conductive layer forms a bit line 580 having electrical connection with the bit line contact 560 and the retained insulation layer forms a cap layer 582 over the bit line 580. The bit line 580 (or the conductive layer) has a structure, for example, composed of a silicide layer over a polysilicon layer. The silicide layer can be a tungsten silicide (WSi$_x$) layer and the cap layer 582 (or the insulation layer) can be a silicon nitride (SiN) layer, for example.

Figure 5B:
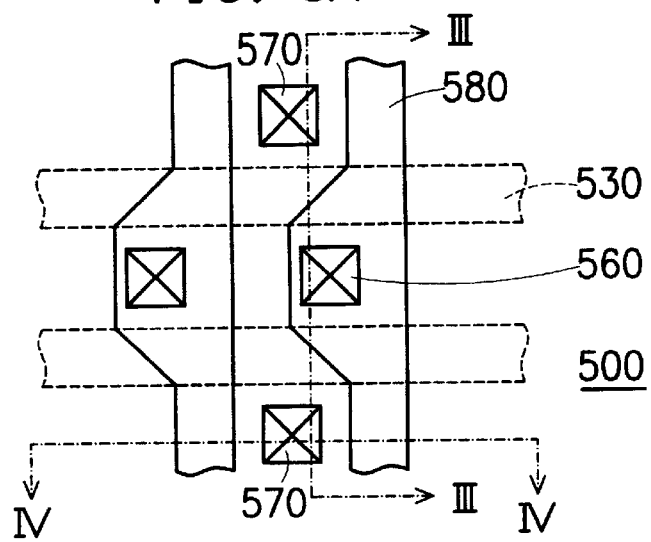
FIG. 5B is a top view of the structure shown in FIGS. 5A and 5C.
Figure 5C:
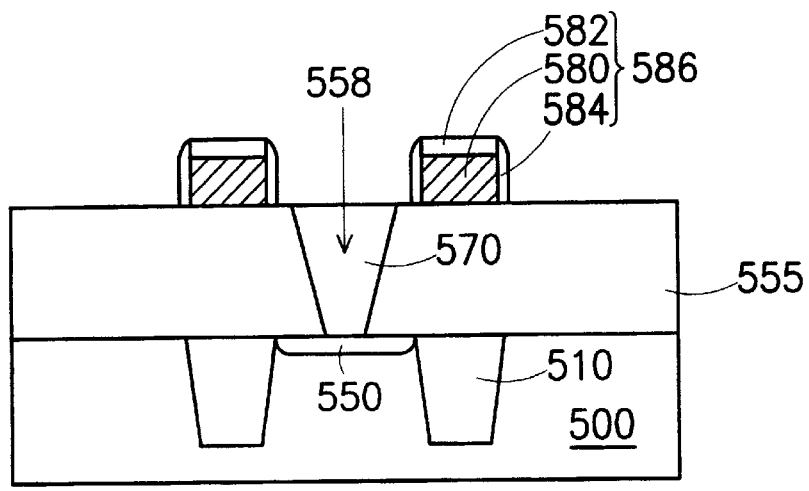

FIG. 5B is a top view of the structure shown in FIGS. 5A and 5C. In fact, FIG. 5A is a cross-sectional view along line III—III of FIG. 5B. In FIG. 5B, the node contact 570 is formed between two bit lines 580. FIG. 5C is a cross-sectional view along line IV—IV of FIG. 5B. In FIG. 5C, a portion of the isolation layer 510 is shown on each side of the drain region 550.

As shown in FIGS. 5A and 5C, spacers 584 are formed on the sidewalls of the bit lines 580 and the cap layers 582. The bit line 580, the cap layer and the spacers 584 on their sidewalls together form a bit line structure 586. The spacers 584 can be silicon nitride layers formed, for example, by chemical vapor deposition and anisotropic etching of silicon nitride.

Figure 6:
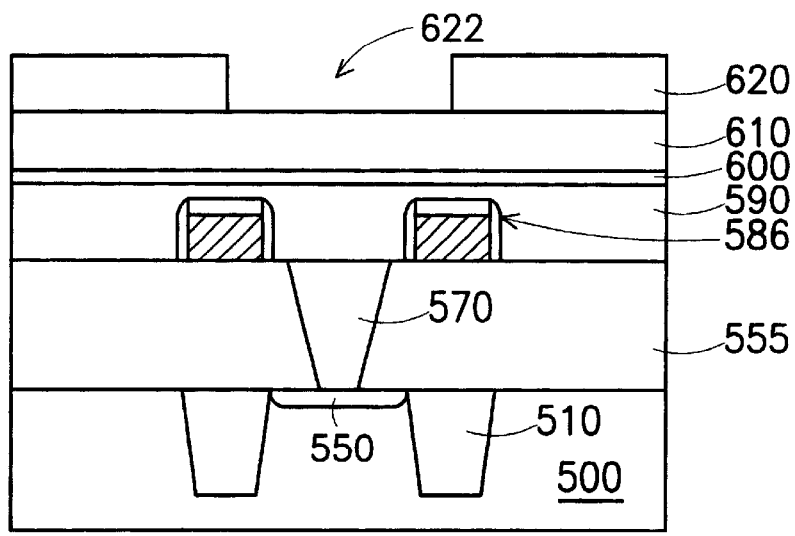

As shown in FIG. 6, an insulation layer 590, an etching stop layer 600 and another insulation layer 610 are sequentially formed over the substrate 500. The insulation layers 590 and 610 can be silicon oxide layers and the etching stop layers 600 can be a silicon nitride layer, for example. A patterned photoresist layer 620 is formed over the insulation layer 610. The patterned photoresist layer 620 has an opening 622 above the node contact 570 and a portion of the bit line structure 586.

Figure 7:
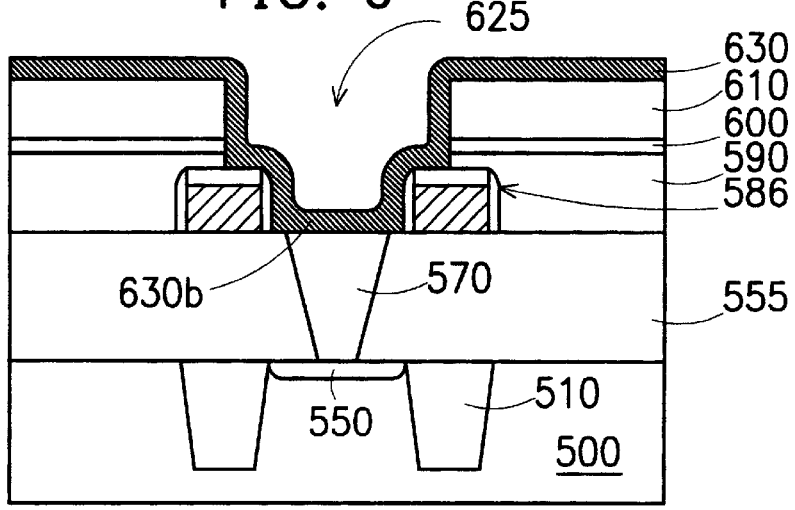

As shown in FIG. 7, an anisotropic etching operation is carried out to form an opening 625 through the insulation layer 590, the etching stop layer 600 and the insulation layer 610 while using the patterned photoresist layer 620 as a mask. The opening 625 exposes a portion of each bit line structure 586 and the node contact 570. Since the bit line 580 is shielded by the cap layer 582 from above and the spacers 584 on each side, an opening 625 far wider than the distance between two bit lines 580 can be formed. In fact, the exposed regions for forming electrical contact with the node contact 570 are increased so much that this processing stage can be regarded as a self-aligned process. A conformal conductive layer 630 whose thickness is insufficient to fill the opening 625 is deposited over the substrate 500. The conductive layer 630 can be a polysilicon layer formed, for example, by chemical vapor deposition. The bottom portion of the conductive layer 630 forms a second section node contact 630b.

Figure 8:
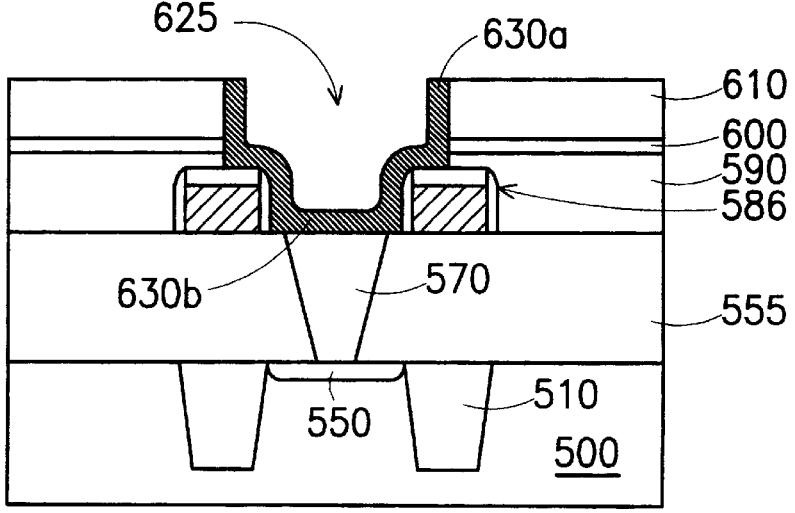

As shown in FIG. 8, the conductive layer 630 lying outside the opening 625 is removed to form the lower electrode 630a of a capacitor, for example, by chemical-mechanical polishing (CMP).

There are two possible methods of finishing fabrication at this point and subsequent steps to carry out depend on which method is selected.

Figure 9:
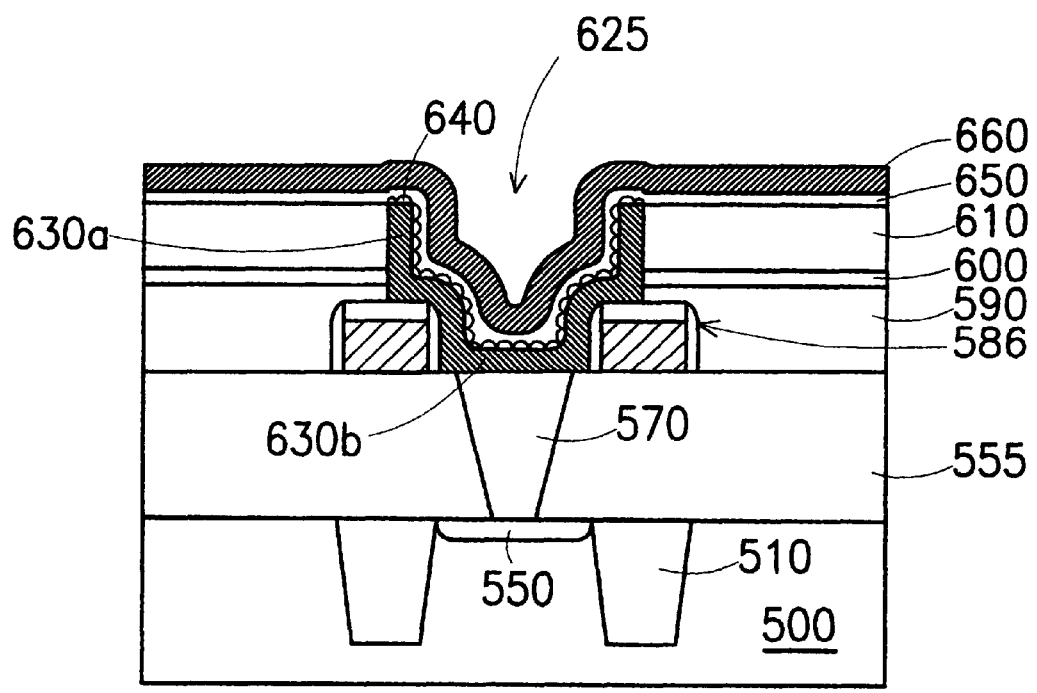

In the first method, steps to form the structure shown in FIG. 9 are followed. Accordingly, hemispherical silicon grains 640 are formed over the exposed surface of the lower electrode 630a so that overall surface area of the lower electrode 630a is increased. A conformal dielectric layer 650 and a conductive layer 660 are sequentially formed over the substrate 500. The conductive layer 660 forms the upper electrode of the capacitor. The dielectric layer 650 can be a composite layer of silicon oxide, silicon nitride and silicon oxide, for example. The conductive layer 660 can be a polysilicon layer, for example.

Figure 10:
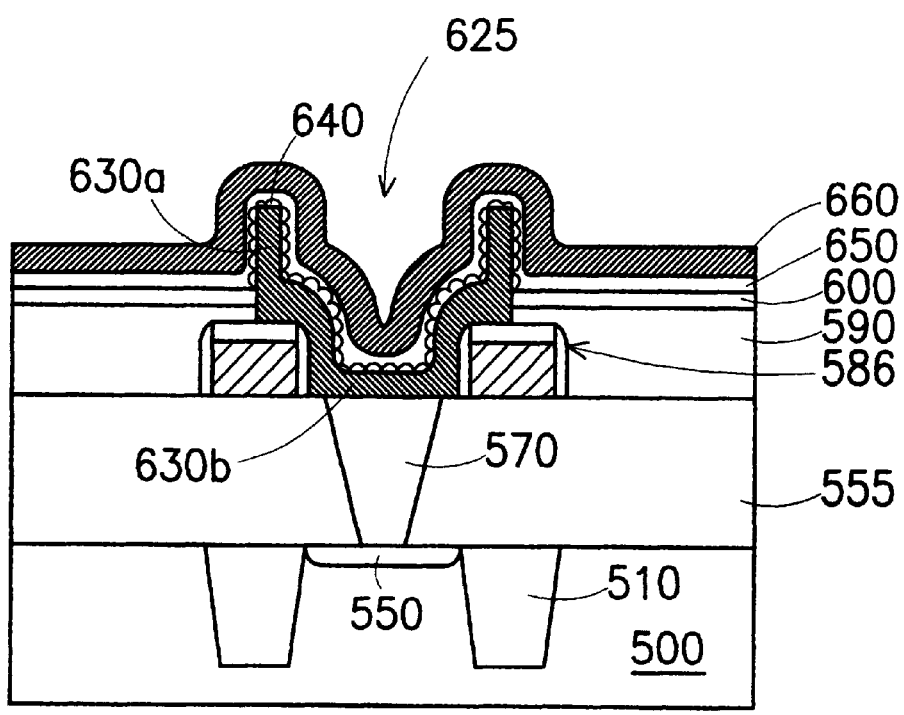

Alternatively, steps to form the structure shown in FIG. 10 are followed. Accordingly, the insulation layer 610 above the etching stop layer 600 is removed, for example, by wet etching. If the insulation layer 610 is a silicon oxide layer, the insulation layer 610 can be removed using an etchant such as hydrofluoric acid (HF). Hemispherical silicon grains 640 are grown over the exposed surface of the lower electrode 630a so that overall surface area of the crown-shaped lower electrode 630a is increased. A conformal dielectric layer 650 and a conductive layer 660 are sequentially formed over the substrate 500. The conductive layer 660 forms the upper electrode of the capacitor. The dielectric layer 650 can be a composite layer of silicon oxide, silicon nitride and silicon oxide, for example. The conductive layer 660 can be a polysilicon layer, for example.

Following the steps illustrated in FIGS. 5A through 10, a stacked capacitor structure is formed. The stacked capacitor structure includes an insulation layer 555, a bit line contact 560, a node contact 570, a bit line structure 586, an insulation layer 590, an etching stop layer 600, a crown-shaped lower electrode 630a, a node contact 630b, hemispherical silicon grains 640, a dielectric layer 650 and a conductive layer 660. The insulation layer 555 is above the substrate 500. The bit line contact 560 pierces through the insulation layer 555 and connects electrically with the common source region 540. The node contact 570 pierces through the insulation layer 555 and connects electrically with the drain region 550. The bit line structure 586 includes a bit line 580, a cap layer 582 and spacers 584. The bit line is above the insulation layer 555 and connects electrically with the bit line contact 560. The cap layer 582 is above the bit line 580. The spacers 584 are on the sidewalls of the cap layer 582 and the bit line 580.

In addition, as shown in FIG. 10, the insulation layer 590 is above the insulation layer 555. The insulation layer 590 has an opening 625 so that the node contact 570 and a portion of the bit line structure 586 are not covered. The etching stop layer 600 is above the insulation layer 590. The node contact 630b is at the bottom of the opening 625 and connects electrically with the node contact 570. The lower portion of the lower electrode 630a forms a conformal layer on the sidewalls within the opening 625. The bottom portion of the lower electrode 630a and the node contact 630b forms an integrated unit. The crown of the lower electrode 630a protrudes over the opening 625. The hemispherical silicon grains 640 are on the surface of the lower electrode 630a. The dielectric layer 650 is on top of the hemispherical silicon grain covered lower electrode 630a and etching stop layer 600. The conductive layer 660 covers the dielectric layer 650. The conductive layer 660 forms the upper electrode of the crown-shaped capacitor.

According to the steps that lead to the structure shown in FIG. 9, the stacked capacitor structure further includes an insulation layer 610. The insulation layer 610 is above the etching stop layer 600. The insulation layer 650 is on top of the hemispherical silicon grain covered lower electrode 630a and insulation layer 610.

In summary, the advantages of using the method of this invention to form a stacked capacitor include the following.

As shown in FIGS. 7 and 8, a self-aligned method is used to form a wide opening 625 passing through the insulation layers 590, 610 and the etching stop layer 600. This opening 625 is then used as a mold for forming the node contact 630b and the crown-shaped lower electrode 630a. Hence, unlike a conventional method that uses photolithographic and etching repeatedly to define the position of the crown-shaped lower electrode and pattern out the shape of the crown-shaped lower electrode, the invention saves a few processing steps. In addition, the crown-shaped lower electrode 630a is embedded within the opening 625 in the insulation layers 590, 610 and the etching stop layer 600. Hence, this invention is free from micro-particle pollution problems resulting from the conventional method where alignment errors in positioning the lower electrode can lead to the shedding of conductive material and the production of micro-particle pollutants.

As shown in FIG. 10, the crown-shaped lower electrode 630a is embedded within the opening 625 in the insulation layer 590 and the etching stop layer 600 (or including the insulation layer 610 as shown in FIG. 9) so that the bottom portion of the crown-shaped lower electrode 630a is at the same level as the bit line 580. Hence, overall processing height level is lowered. In other words, the aspect ratio for etching out a contact opening in a subsequent process is decreased and a higher tolerance for the contact opening is obtained.

In addition, the node contact 630b is formed after the cap layer 582 is formed above the bit line 580 and spacers 584 are formed on the sidewalls of the bit line 580, respectively. Hence, short-circuiting between the node contact and the bit line due to alignment errors of the second section node contact are prevented. In other words, tolerance of photolithographic and etching processes for forming the node contact opening is increased. Furthermore, unlike the conventional method, this invention does not require the formation of a silicon nitride liner layer on the sidewalls of the second section node contact opening to prevent short-circuiting between the bit line and the second section node contact. Hence, this invention requires fewer processing steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a self-aligned stacked capacitor, comprising the steps of:
   providing a substrate having a first insulation layer thereon;
   forming a bit line contact and a first section node contact through the first insulation layer and a bit line structure above the first insulation layer, wherein the bit line structure includes a bit line, a cap layer and spacers, the bit line connects electrically with the bit line contact, the cap layer is above the bit line and the spacers are on sidewalls of the bit line and the cap layer;
   sequentially forming a second insulation layer, an etching stop layer and a third insulation layer over the substrate;
   forming an opening through the second insulation layer, the etching stop layer and the third insulation layer to expose a portion of the bit line structure and the first section node contact;
   forming a conformal first conductive layer over an interior surface of the opening to form a second section node contact, wherein a bottom portion of the first conductive layer forms a bottom section of a lower electrode and an upper portion of the first conductive layer forms a crown-shaped section of the lower electrode; and
   sequentially forming a conformal dielectric layer and a second conductive layer over the substrate, wherein the second conductive layer forms an upper electrode of the stacked capacitor.

2. The method of claim 1, wherein after the step of forming the first conductive layer over the interior surface of the opening, further includes removing the third insulation layer.

3. The method of claim 2, wherein the step of removing the third insulation layer includes wet etching.

4. The method of claim 2, wherein after the step of removing the third insulation layer further includes forming hemispherical silicon grains on the exposed surface of the lower electrode.

5. The method of claim 1, wherein after the step of forming the crown-shaped lower electrode further includes forming hemispherical silicon grains over the exposed surface of the crown-shaped lower electrode.

6. The method of claim 1, wherein the step of forming the conformal first conductive layer over the interior surface of the opening includes the substeps of:
   depositing conductive material to form a conformal conductive layer over the substrate; and
   removing excess conductive material outside the opening by chemical-mechanical polishing.

7. The method of claim 1, wherein material forming the first conductive layer and the second conductive layer includes polysilicon.

8. The method of claim 1, wherein material forming the second insulation layer includes silicon oxide.

9. The method of claim 1, wherein material forming the third insulation layer includes silicon oxide.

10. The method of claim 1, wherein material forming the etching stop layer includes silicon nitride.

11. The method of claim 1, wherein material forming the cap layer includes silicon nitride.

12. The method of claim 1, wherein material forming the spacers includes silicon nitride.

13. The method of claim 1, wherein step of forming the dielectric layer includes sequentially depositing oxide, nitride and oxide to form an oxide/nitride/oxide composite layer.

14. The method of claim 1, wherein the step of forming the bit line includes sequentially depositing polysilicon material and silicide material over the substrate.

15. The method of claim 14, wherein material forming the silicide layer includes tungsten silicide.

* * * * *